Figure 1:
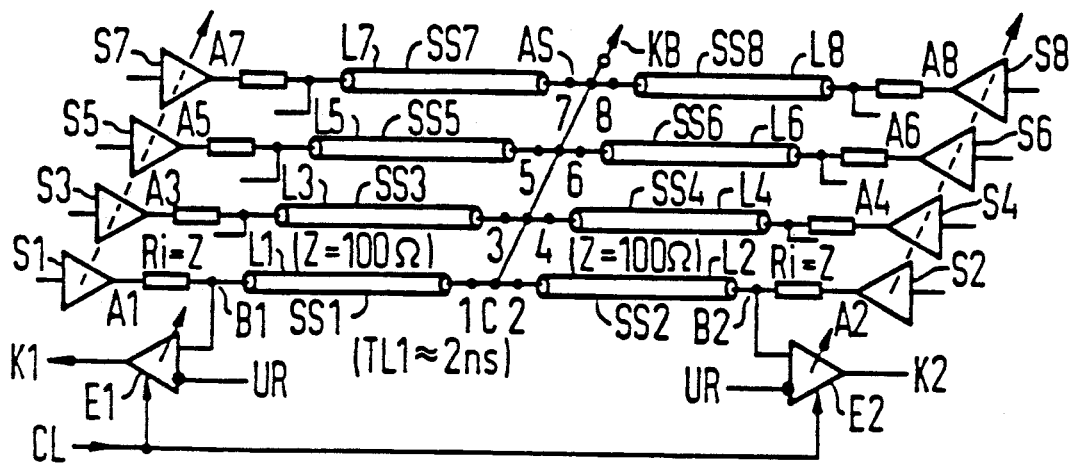

United States Patent [19]

Welzhofer et al.

[11] Patent Number: 5,058,087
[45] Date of Patent: Oct. 15, 1991

[54] PROCESS FOR DETERMINING THE ELECTRICAL DURATION OF SIGNAL PATHS

[75] Inventors: Klaus Welzhofer, Graefelfing; Antun Vuksic, Munich, both of Fed. Rep. of Germany

[73] Assignee: Siemens Aktiengesellschaft, Berlin & Munich, Fed. Rep. of Germany

[21] Appl. No.: 445,700

[22] PCT Filed: May 5, 1987

[86] PCT No.: PCT/DE88/00274

§ 371 Date: Jan. 25, 1990

§ 102(e) Date: Jan. 25, 1990

[87] PCT Pub. No.: WO88/09511

PCT Pub. Date: Dec. 1, 1988

[30] Foreign Application Priority Data

May 29, 1987 [DE] Fed. Rep. of Germany ....... 3718113

[51] Int. Cl.$^5$ .................... G04F 8/00; G01R 15/12; G06F 11/14
[52] U.S. Cl. ................... 368/113; 368/118; 324/73.1; 371/22.1
[58] Field of Search ............ 368/113, 118–120; 224/73 R, 73 AT; 371/15, 21, 21.2

[56] References Cited

U.S. PATENT DOCUMENTS

| | | | |
|---|---|---|---|
| 4,097,801 | 6/1978 | Freeman et al. | 368/118 |
| 4,569,599 | 2/1986 | Bolkow et al. | 368/120 |
| 4,688,947 | 8/1987 | Blaes et al. | 368/120 |
| 4,792,932 | 12/1988 | Bowhers et al. | 368/113 |
| 4,841,500 | 6/1989 | Lee | 368/120 |
| 4,858,208 | 8/1989 | Swapp | 368/118 |
| 4,866,685 | 9/1989 | Lee | 368/117 |
| 4,878,209 | 10/1989 | Bassett et al. | 368/113 |

FOREIGN PATENT DOCUMENTS 2752331 12/1978 Fed. Rep. of Germany.
2833608 2/1980 Fed. Rep. of Germany.

OTHER PUBLICATIONS

"Inferred On-Chip Waveform Delay Measurement Technique", IBM Technical Disclosure Bulletin, vol. 28, No. 9, Feb. 1986, Armonk, N.Y. (U.S.), pp. 4048–4049.

Osinga/Maaskant: "Handbuch der Elektronischen", Messgeraete, 1984, pp. 273–281.

Primary Examiner—Vit W. Miska
Attorney, Agent, or Firm—Kenyon & Kenyon

[57] ABSTRACT

In particular in automatic testing equipment for integrated circuits, all signal sections at the test piece joint should ideally be of the same electrical length. The signal sections used in the test consist, in the case of reception, of cable, comparator, error logic, etc. If the signal sections are of different electrical durations, then in the case of reception, the transmitted signal must be connected. In a process for determining the electrical duration of signal sections, each of which has a transmitter and a receiver and at the end connecting points for example for an integrated circuit, the connecting points (AS) of all signal sections (SS) are short-circuited, all receivers up to the receiver of the signal section to be measured are then switched off, all transmitters up to the transmitter of the signal section to be measured are switched on and simultaneously emit a pulse which is transmitted to the connecting point. At the short-circuited connecting points (AS) of the signal sections (SS), a central pulse (21) is then produced which is transmitted over the signal section to be measured to its receiver (E). The time at which the pulse produced by the central pulse enters the receiver (E) is recorded and entered in a table. The above-mentioned process is carried out for all signal sections. The measurements so obtained give the relative durations of the various signal sections. The process for determining the duration of signal sections requires only that the connecting points of the signal sections be connected with one another through a short-circuit bridge (KB).

20 Claims, 1 Drawing Sheet

PROCESS FOR DETERMINING THE ELECTRICAL DURATION OF SIGNAL PATHS

The invention relates to a method for determining the electrical transit time of signal runs which are connected in each instance at one end to a terminal, e.g. for an integrated component, and which have at the other end a transmitter and a receiver.

Such a method is known for example from OSINGA/MAASKANT, "Handbuch der elektronischen Messgeraete" (Manual of Electronic Measuring Devices), 1984, pages 273 to 281, where measurements on transmission runs by the so-called "Time Domain Reflectometer (TDR) System" are described.

Automatic testers serve to check e.g. integrated circuits for absence of faults. To this end the automatic tester has connections, e.g. contact elements, into which the testpiece is plugged. Thereafter test signals are supplied to the testpiece from the tester, and the reply signals delivered thereupon by the testpiece are taken off and compared with nominal signals. Transmission of the test signals and of the reply signals occurs via signal runs, a signal run being connected to a terminal of the testpiece in each instance. Each signal run has a transmitter for the generation of test signals or respectively a receiver for the evaluation of the reply signals. Depending on whether the connection of the testpiece at a signal run is an output or an input, each signal run is operated in one or the other direction.

In testers for integrated circuits, in the ideal case all signal paths at the connecting point for the testpiece, also called testpiece interface, must have the same electrical length, that is, the signal runs involved in the test, having, for triggering (testpiece inputs), a formatting logic, driver, cables, etc., or, for reception (testpiece outputs), cables, a comparator, error logic, etc., should have the same electrical transit time, or should, under different load conditions, take into account the occurring distortion of the driver pulse edges and their passage through the circuit switching threshold of the testpiece. Since, however, the individual signal runs have a different transit time, the signals transmitted via the signal runs must be corrected. This process is called "deskewing". This correction can be performed by complex external measuring methods. For example, via an integrated relay switch matrix in conjunction with special drivers and comparator circuits, pulses can be fed to or taken off the testpiece interface, thus determining the transit time of the individual signal run. This method, however, is complex and does not take into consideration that also the additionally inserted circuits have a transit time.

It is the object of the invention to state a method wherein, without any great additional expense, a correction value for the case of reception can be obtained to correct different transit times of signal runs. In a method according to the preamble of claim 1, this problem is solved by the features of the characterizing part of claim 1.

Developments of the invention are evident from the sub-claims.

The advantage of the method according to the invention is that as additional element only a shortcircuit bridge is required, which is plugged in at the testpiece interface instead of a testpiece. The signal used for measuring the transit time is then automatically produced as central pulse by means of the existing signal runs whose transit time is not being checked, which (central pulse) has approximately the same form for all signal runs to be measured. If the occurrence in time of the output signal of the receiver is detected as a function of the central pulse, and this for all signal runs, relative values will result which characterize the different transit time of the transmission of signals from the interface via the signal runs to the receivers. By normalizing these values, e.g. to the lowest value, a correction factor can be obtained which can be made use of for the correction of the transit times over the signal runs and which causes the electrical conditions on the various transit time runs to be compensated.

Figure 2:
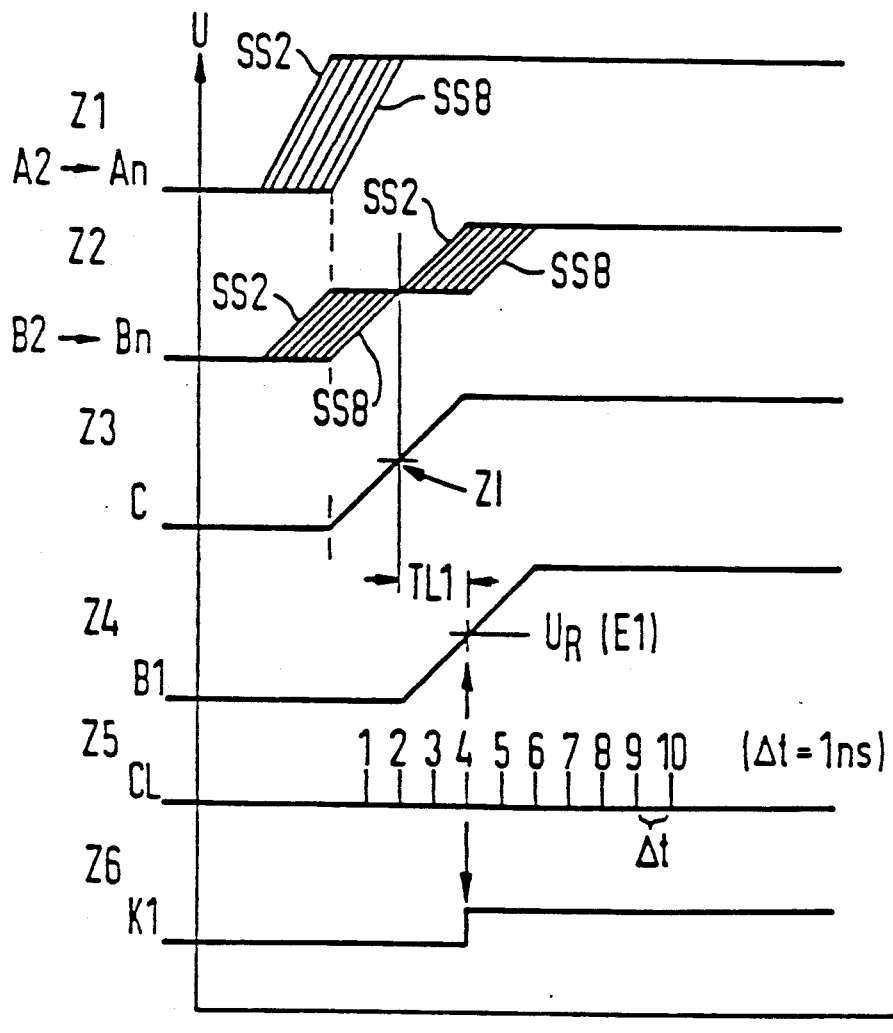

The invention will be further explained with reference to an embodiment which is illustrated in the figures. They show FIG. 1 a basic diagram of the signal runs which lead to the connecting points for a testpiece and whose different transit time is to be determined;

FIG. 2 a pulse diagram plotted over time t, with reference to which the method will be explained.

From FIG. 1 are seen e.g. eight signal runs SS, connected at connecting points AS. Plugged in at the connecting points AS is e.g. in the case of testing a testpiece, e.g. an integrated circuit. According to the method, these connecting points are, however, interconnected by a shortcircuit bridge KB. The number of signal runs may in reality be much greater, e.g. 1024.

The signal runs may consist e.g. of a transmitter S, a line L, a receiver E. The transmitter S may be e.g. a driver stage, the receiver E a comparator stage. At the output of the transmitter S, before the line L, a resistor R may additionally be inserted.

In the case of testing, test signals are delivered via the transmitter S; they are transmitted via line L to the connecting point AS and thence reach a testpiece input. If a connecting point AS is connected to a testpiece output, a reply signal delivered by the testpiece is transmitted to the receiver E via line L. The receiver E evaluates the reply signal by means of a reference voltage UR and delivers a corresponding signal K at the output. This operation of a tester is known and therefore need not be explained further.

To determine the different transit times of the individual signal runs SS, the connecting points AS for the testpiece are shortcircuited by means of the shortcircuit bridge KB. Then all transmitters S except for the transmitter of the signal run to be measured are turned on, and all receivers E except for the receiver of the signal run to be measured turned off. If e.g. the signal run SSI is to be checked, the transmitter S1 of this signal run is turned off, and the receiver E1 of this signal run turned on. The turned-on transmitters S of the signal runs not to be measured are then activated simultaneously and deliver a transmission pulse at output A. As the individual transmitters S may already have different transit times, the pulses appear at the output of the active transmitters S at different times. This is indicated in row Z1 of FIG. 2, e.g. the first pulse edge is assumed to be the pulse edge which appears at the output A2 of the signal run SS2. The last pulse edge of row Z1 is assumed to be the pulse edge which appears at the output A8 of the signal run SS8. The pulse diagram of row Z1 is a superposition of the pulses occurring at the points A of the signal runs in their time relationship with one another.

At point B of the signal runs SS there will then occur the pulse edges shown in row Z2. In the embodiment example there is at point B a voltage divider which halves the amplitude of the pulse of point A. Again the first pulse is the pulse at point B2 of the signal run SS2, and the last pulse the pulse at point B8 of the eighth signal run SS8. The individual pulses of the various signal runs are again shown superposed in row Z2.

The pulse edge at point B is now transmitted via line L to point C, the interface AS. After a transit time established by line L, the pulse edge appears at point C, as is shown in FIG. 2, row Z3. As the connecting points AS are shortcircuited with the shortcircuit bridge KB, the pulses transmitted via the line L superposed to form a central pulse ZI composed of the pulse edges transmitted via the signal runs SS and the pulse edges reflected at point C. The form of this central pulse ZI hardly changes when other signal runs are measured, as due to the plurality of signal runs over which pulses are transmitted, differences in transit time of the individual signal runs are compensated.

Now in row Z2 it is shown further that the individual pulse edges transmitted over the lines L are reflected at point C and are transmitted back to point B of the signal run. In this manner the pulse edge at point B is raised to double the value.

The central pulse ZI at point C continues to run over line L1 of the signal run SSI and reaches point B1 of the signal run SSI after the lapse of the transit time TLI of line L1. This is shown in row Z4 of FIG. 2. Thus the pulse edge of the central pulse gets also to the receiver E1. If at this point the amplitude of the central pulse exceeds the reference voltage UR, the receiver E can deliver a signal. The time when this signal appears is established by means of a strobe pulse CL, which is shown in row Z5. This means that at the output of the receiver El a signal according to row Z6 appears when the central pulse exceeds the reference voltage UR and at the same time a strobe pulse CL is present. In the embodiment example of FIG. 2 this is the case e.g. for the strobe pulse 4.

This value, e.g. for SSI the strobe pulse 4, is stored in a table and is a measure of the transit time of a pulse from point C to the output of the receiver El.

The method just described is repeated for all signal runs, the transmitters of the signal runs not to be measured being always activated simultaneously and only the receiver of the signal run to be measured being turned on. If the strobe pulse CL is started always at the same time in comparison with the time of the activation of the transmitter S, it is possible to establish for each signal run the number of strobe pulses upon occurrence of the pulse edge of the central pulse ZI at the receiver of the signal run to be measured and to make use of this value as a measure of the transit time. In this manner relative values for the various transit times of the signal runs are obtained which are a characteristic of the different transit times of the signal runs. Now if these measured values are also normalized, e.g. to the lowest value, then the signals transmitted over the signal runs can be corrected with the aid of this normalized value of each signal run.

It is essential to the method that the transmitters are activated simultaneously and that the strobe pulses are turned on for all signal runs simultaneously. The transmitter of the signal run to be measured is then turned off in each instance or serves, due to its matched output resistance (e.g. R at point A equals Z), as terminating resistor for the wave guide of the signal run. In this manner one obtains for each signal run relative to the central pulse edge an individual measured value, which can be deposited e.g. in a table. In an additional table, the transit time differences can then be entered as correction values (skew values).

Apart from a shortcircuit bar KB, the described transit time correction method requires no additional electronic means for the calibration of an automatic tester. This means that all calibration processes can be carried out internally of the tester. As this correction method relates all measured values to the strobe pulse CL and its fine delay resolution, the calibration will be the more precise, the more linear the strobe pulse and the more finely graduated its delay resolution is. Naturally this method can be used also for picking up and calibrating other signals internal to the tester provided they are accessible via the connecting points AS.

Also the generation of the central pulse edge by the transmitters shortcircuited at the connecting points AS and activated in parallel presents few problems, as the internal resistance of this pulse edge consists of n parallel-connected signal runs. Assuming for example that the characteristic impedance of a signal run is $R = 100$ Ohm, then the internal resistance for e.g. 100 parallel-connected transmission runs is 100 Ohm : 100 = 1 Ohm, owing to which a skew error of a single transmitter of e.g. 2 ns appears as only 2 ns : 100 = 20 ps. The absolute position of the central pulse edge is not relevant in this method. An arrangement for generating the strobe pulses has not been shown; such arrangements are known and are, as a rule, present in automatic testers.

What is claimed is:

1. A method for determining the electric transit time of signal runs which are in each instance connected at one end to a connecting point and which have at the other end a transmitter and a receiver comprising the steps of:
    a) short circuiting the connecting points (AS) of all signal runs (SS),
    b) turning off all receivers (E) except the receiver of the signal run to be measured,
    c) turning on all transmitters (S) except the transmitter of the signal run to be measured and simultaneously delivering a transmission pulse which is transmitted to the associated connecting point,
    d) superposing the transmission pulses at the shortcircuited connecting points (AS) to form a central pulse (ZI), and transmitting said central pulse over the signal run to be measured to the associated receiver,
    e) establishing the time of occurrence of a pulse triggered by the central pulse at the output of the receiver of the signal run to be measured and entering that time in a table as a measured value characterizing the transit time,
    f) repeating steps a) to e) for all signal runs.

2. The method according to claim 1, wherein said measured values stored in the table are normalized, said measured values being normalized using the lowest value.

3. The method according to claim 1 or 2, further comprising the step of starting strobe pulses at a fixed time in comparison with the triggering of transmission pulses to establish a time of occurrence of the central pulse (ZI) at the receiver of the signal run to be measured, the number of strobe pulses provided for control of the transmitter by the central pulse are counted.

4. The method according to claim 1, wherein said receiver (E) is a comparator which delivers the output pulse when the pulse triggered by the central pulse exceeds a reference value (UR) and a strobe pulse (CL) is present.

5. The method according to claim 1, wherein the signal runs (SS) comprise the transmitter (S), a line (L) connected to the output, and the receiver (E) connected at the junction point between transmitter and line, the free end of the line (L) forming the connecting point (AS).

6. The method according to claim 1, wherein the signal runs (SS) form the reception signal path from the test pin of an automatic tester.

7. The method according to claim 2, wherein said receiver (E) is a comparator which delivers the output pulse when the pulse triggered by the central pulse exceeds a reference value (UR) and a strobe pulse (CL) is present.

8. The method according to claim 3, wherein said receiver (E) is a comparator which delivers the output pulse when the pulse triggered by the central pulse exceeds a reference value (UR) and a strobe pulse (CL) is present.

9. The method according to claim 2, wherein the signal runs (SS) comprise the transmitter (S), a line (L) connected to the output, and the receiver (E) connected at the junction point between transmitter and line, the free end of the line (L) forming the connecting point (AS).

10. The method according to claim 3, wherein the signal runs (SS) comprise the transmitter (S), a line (L) connected to the output, and the receiver (E) connected at the junction point between transmitter and line, the free end of the line (L) forming the connecting point (AS).

11. The method according to claim 4, wherein the signal runs (SS) comprise the transmitter (S), a line (L) connected to the output, and the receiver (E) connected at the junction point between transmitter and line, the free end of the line (L) forming the connecting point (AS).

12. The method according to claim 7, wherein the signal runs (SS) comprise the transmitter (S), a line (L) connected to the output, and the receiver (E) connected at the junction point between transmitter and line, the free end of the line (L) forming the connecting point (AS).

13. The method according to claim 8, wherein the signal runs (SS) comprise the transmitter (S), a line (L) connected to the output, and the receiver (e) connected at the junction point between transmitter and line, the free end of the line (L) forming the connecting point (AS).

14. The method according to claim 2, wherein the signal runs (SS) form the reception signal path from the test pin of an automatic tester.

15. The method according to claim 3, wherein the signal runs (SS) form the reception signal path from the test pin of an automatic tester.

16. The method according to claim 4, wherein the signal runs (SS) form the reception signal path from the test pin of an automatic tester.

17. The method according to claim 5, wherein the signal runs (SS) form the reception signal path from the test pin of an automatic tester.

18. The method according to claim 8, wherein the signal runs (SS) form the reception signal path from the test pin of an automatic tester.

19. The method according to claim 9, wherein the signal runs (SS) form the reception signal path from the test pin of an automatic tester.

20. The method according to claim 13, wherein the signal runs (SS) form the reception signal path from the test pin of an automatic tester.

* * * * *